US010761120B2

(12) United States Patent
Feucht et al.

(10) Patent No.: US 10,761,120 B2
(45) Date of Patent: Sep. 1, 2020

(54) CURRENT SENSOR SYSTEM

(71) Applicant: Allegro MicroSystems, LLC, Manchester, NH (US)

(72) Inventors: Christian Feucht, Annecy (FR); Shaun D. Milano, Dunbarton, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 615 days.

(21) Appl. No.: 15/435,725

(22) Filed: Feb. 17, 2017

(65) Prior Publication Data

US 2018/0238938 A1    Aug. 23, 2018

(51) Int. Cl.
| | |
|---|---|
| *G01R 19/25* | (2006.01) |
| *G01R 15/20* | (2006.01) |
| *G01R 35/00* | (2006.01) |
| *G01R 33/00* | (2006.01) |
| *G01R 33/02* | (2006.01) |

(52) U.S. Cl.
CPC ......... *G01R 19/25* (2013.01); *G01R 15/202* (2013.01); *G01R 15/205* (2013.01); *G01R 19/2506* (2013.01); *G01R 33/0023* (2013.01); *G01R 33/0082* (2013.01); *G01R 33/02* (2013.01);

(Continued)

(58) Field of Classification Search
None
See application file for complete search history.

(56) References Cited

U.S. PATENT DOCUMENTS

| | | | | |
|---|---|---|---|---|
| 4,757,420 A | * | 7/1988 | Saletta | G01R 19/25 |
| | | | | 324/77.11 |
| 6,300,617 B1 | * | 10/2001 | Daughton | G01R 15/205 |
| | | | | 250/214.1 |

(Continued)

FOREIGN PATENT DOCUMENTS

| | | | | |
|---|---|---|---|---|
| GB | 2547732 A | * | 8/2017 | ........... G01R 15/205 |
| WO | WO 2017/144715 A1 | | 8/2017 | |

OTHER PUBLICATIONS

Melexis Inspired Engineering; "Current Sensors Reference Design Guide"; Aug. 2016; 27 Pages.

(Continued)

*Primary Examiner* — Gregory J Toatley, Jr.
*Assistant Examiner* — Brandon J Becker
(74) *Attorney, Agent, or Firm* — Daly, Crowley, Mofford & Durkee, LLP

(57) ABSTRACT

Systems and methods are described herein for reducing the effects of magnetic field cross-coupling in a multi-conductor current sensor system. A current sensor system includes one or more current sensors, each positioned proximate to at least one conductor and spaced from at least one other conductor. Each conductor carries a current intended to be measured by a respective current sensor. The current sensors include one or more magnetic field sensing elements to generate a magnetic field signal indicative of a detected magnetic field. A characterization measurement is performed to determine the coupling between each current sensor and the respective current conductor and to determine the coupling between the current sensor and the other ones of the current conductors, by providing a reference current to each of the conductors and measuring the outputs at each of the current sensors. The characterization measurement can be used to generate a coupling matrix.

22 Claims, 6 Drawing Sheets

(52) U.S. Cl.
CPC ........ *G01R 35/005* (2013.01); *G01R 19/2513* (2013.01)

(56) References Cited

U.S. PATENT DOCUMENTS

| | | | |
|---|---|---|---|
| 6,583,613 B1 * | 6/2003 | Hohe | G01R 15/20 |
| | | | 324/117 R |
| 7,746,056 B2 | 6/2010 | Stauth et al. | |
| 7,923,996 B2 | 4/2011 | Doogue et al. | |
| 8,030,918 B2 | 10/2011 | Doogue et al. | |
| 8,447,556 B2 * | 5/2013 | Friedrich | G01R 33/0023 |
| | | | 702/117 |
| 8,542,010 B2 | 9/2013 | Cesaretti et al. | |
| 8,680,846 B2 | 3/2014 | Cesaretti et al. | |
| 8,692,546 B2 | 4/2014 | Cesaretti et al. | |
| 8,818,749 B2 | 8/2014 | Friedrich et al. | |
| 8,896,295 B2 | 11/2014 | Friedrich et al. | |
| 8,907,669 B2 | 12/2014 | Petrie | |
| 9,081,041 B2 | 7/2015 | Friedrich et al. | |
| 9,151,807 B2 | 10/2015 | Friedrich et al. | |
| 9,201,122 B2 | 12/2015 | Cesaretti et al. | |
| 2007/0279053 A1 * | 12/2007 | Taylor | G01R 15/207 |
| | | | 324/252 |
| 2012/0001617 A1 | 1/2012 | Reynolds | |
| 2012/0253726 A1 | 10/2012 | Xu | |
| 2013/0015843 A1 | 1/2013 | Doogue et al. | |
| 2014/0266181 A1 | 9/2014 | Milano et al. | |
| 2014/0312883 A1 | 10/2014 | Friedrich et al. | |
| 2015/0301149 A1 | 10/2015 | Cesaretti et al. | |
| 2015/0331079 A1 * | 11/2015 | Kolwalkar | G01R 19/2503 |
| | | | 702/104 |
| 2015/0338444 A1 | 11/2015 | Ivanov et al. | |
| 2015/0362532 A1 * | 12/2015 | Chartouni | G01R 35/005 |
| | | | 324/126 |
| 2016/0274060 A1 * | 9/2016 | Denenberg | G01N 27/9046 |

OTHER PUBLICATIONS

Extended European Search Report dated Jul. 10, 2018 for EP Application No. 18154879.3; 10 Pages.
Notice of Allowance dated Jun. 7, 2019 for European Application No. 18154879.3; 7 Pages.
Response filed on Feb. 22, 2019 for European Application No. 18154879.3; 20 Pages.

* cited by examiner

CURRENT SENSOR SYSTEM

BACKGROUND

Some conventional electrical current sensors are positioned near a current-carrying conductor to sense a magnetic field generated by the current through the conductor. The current sensor generates an output signal having a magnitude proportional to the magnetic field induced by the current through the conductor.

The accuracy with which a magnetic field-based current sensor senses an intended current can be affected by its immunity to stray magnetic fields. Some conventional current sensors employ shields, sometimes in the form of a ferrite or other magnetic core positioned around the conductor, to concentrate the magnetic field in the vicinity of the sensor and to thereby provide a level of shielding against stray fields, such as those that may be caused by currents flowing in adjacent conductors.

SUMMARY

Systems and methods described herein are directed towards compensation techniques for multi-conductor current measurement systems to reduce effects of magnetic cross-coupling. The current sensor system includes a plurality of current sensors each positioned proximate to at least one respective conductor carrying a current intended to be measured by the current sensor and spaced from at least one other adjacent conductor carrying currents not intended to be measured by the current sensor. Each of the conductors carries a current intended to be measured by the respective current sensor. The current sensors include one or more magnetic field sensing elements configured to generate a magnetic field signal indicative of a detected magnetic field.

However, magnetic coupling can occur in multi-conductor current measurement between a current sensor and adjacent conductors carrying currents not intended to be measured by the current sensor. Thus, the detected magnetic field and corresponding generated magnetic field signal may include magnetic field attributable not only to the respective, intended conductor, but also magnetic field attributable to one or more of the other, adjacent conductors.

Systems and methods described herein can be used to characterize magnetic coupling between a current sensor and each of the plurality of conductors in a multi-conductor system. An intended coupling factor can be indicative of a magnetic coupling between a current sensor and the respective one of the plurality of conductors and one more parasitic coupling factors can be indicative of a magnetic coupling between the current sensor and other ones of the plurality of conductors.

In an embodiment, the intended coupling factor and one or more parasitic coupling factors can be determined by applying a reference current at a predetermined level to each of the conductors. For example, a characterization measurement can be performed by forcing a sufficiently high current through one conductor and measuring the outputs of each of the current sensors in the current sensor system. The characterization measurement provides the intended coupling factor between the current sensor and its respective conductor and one or more parasitic coupling factors between the current sensor and the other, remaining conductors. The characterization measurement can be repeated for each conductor. The intended coupling factor and parasitic coupling factors can be provided in units of sensor output voltage per conductor current (e.g., mV/A).

The outputs of each of the current sensors can be coupled to a controller. The controller can be configured to generate a coupling matrix to characterize the magnetic coupling between the current sensors and each of the conductors. For example, the coupling matrix can include an intended coupling factor and one or more parasitic coupling factors for each of the sensors. Having generated the coupling matrix, an inverse coupling matrix can be generated and used to determine conductor currents.

In a first aspect, a current sensor system includes a plurality of current sensors, each positioned proximate to a respective one of a plurality of conductors configured to carry a current to be measured and spaced from one or more other ones of the plurality of current sensors, each current sensor comprising one or more magnetic field sensing elements configured to generate a respective magnetic field signal indicative of a detected magnetic field. A controller is coupled to receive the magnetic field signal from each of the plurality of current sensors and, for each current sensor, is configured to characterize a magnetic coupling between the current sensor and each of the plurality of conductors.

For each current sensor, the controller can be configured to determine an intended coupling factor indicative of a magnetic coupling between the current sensor and the respective one of the plurality of conductors and one or more parasitic coupling factors indicative of a magnetic coupling between the respective one of the plurality of conductors and the other ones of the plurality of current sensors and use the intended coupling factor and the one or more parasitic coupling factors to determine the current in one or more of the plurality of conductors.

The controller may comprise a processor configured to generate a coupling matrix comprising the intended coupling factor and the one or more parasitic coupling factors for each of the plurality of current sensors. The processor can be configured to generate an inverse coupling matrix corresponding to an inverse matrix of the coupling matrix. The processor may comprise a multiplier configured to multiply the magnetic field signal from each of the plurality of current sensors by the inverse coupling matrix.

In some embodiments, each of the plurality of conductors comprises a bus bar. Each bus bar can include a notch and the respective current sensor can be positioned in the notch.

The one or more magnetic field sensing elements may comprise one or more of magnetoresistance elements or Hall effect elements. The one or more magnetic field sensing elements may comprise one or more giant magnetoresistance elements.

In another aspect, a method for determining a current in one or more of a plurality of conductors is provided. The method comprises providing a plurality of current sensors, providing a plurality of conductors, each configured to carry a current to be measured, positioning each of the plurality of current sensors in proximity to a respective one of the plurality of conductors and spaced from the other ones of the plurality of conductors, for each current sensor, characterizing a magnetic coupling between the current sensor and each of the plurality of conductors, and using the magnetic coupling characterization to determine the current in one or more of the plurality of conductors.

Providing the plurality of current sensors may comprise providing each current sensor with one or more magnetic field sensors configured to generate a respective magnetic field signal indicative of a detected magnetic field. In some embodiments, characterizing the magnetic coupling comprises determining an intended coupling factor indicative of a magnetic coupling between the current sensor and the respective one of the plurality of conductors and determining one or more parasitic coupling factors indicative of a magnetic coupling between the respective one of the plurality of conductors and the other ones of the plurality of current sensors.

The method may further comprise forming a coupling matrix containing the intended coupling factor and the one of more parasitic coupling factors and generating an inverse coupling matrix corresponding to an inverse of the coupling matrix. In an embodiment, the magnetic coupling characterization can be used to determine the current in one or more of the plurality of conductors by multiplying the magnetic field signals from each of the plurality of current sensors by the inverse matrix.

In some embodiments, determining the intended coupling factor indicative of the magnetic coupling between the current sensor and the respective one of the plurality of conductors comprises providing a reference current to the respective one of the plurality of conductors and measuring the magnetic field signal from the current sensor.

Determining the one or more parasitic coupling factors indicative of the magnetic coupling between the respective one of the plurality of conductors and the other ones of the plurality of current sensors may comprise providing a reference current to the respective one of the plurality of conductors and measuring the magnetic field signal from the other ones of the plurality of current sensors.

In another aspect, a method for determining a current in one or more conductors of a current sensor system comprising a plurality of current sensors, each positioned proximate to a respective one of a plurality of conductors and spaced from one or more other ones of the plurality of conductors is provided. The method comprises, for each of the plurality of conductors, providing a reference current to the conductor and measuring an output signal of the respective current sensor and each of the other ones of the plurality of current sensors, generating a coupling matrix comprising, for each of the plurality of current sensors, an intended coupling factor indicative of a magnetic coupling between the current sensor and the respective one of the plurality of conductors and one or more parasitic coupling factors indicative of a magnetic coupling between the respective one of the plurality of conductors and the other ones of the plurality of current sensors, determining an inverse coupling matrix based on the coupling matrix, and using the inverse coupling matrix to determine a current in one or more of the plurality of conductors.

In some embodiments, providing the reference current to each of the plurality of conductors comprises providing the reference current to each of the plurality of conductors in a predetermined order. Measuring the output signal of the respective current sensor and each of the other ones of the plurality of current sensors may comprise measuring a magnetic field signal generated by the respective current sensor and each of the other ones of the plurality of current sensors in response to a detected magnetic field.

The inverse coupling matrix can be used to determine the current in one or more of the plurality of conductors by multiplying the inverse coupling matrix by a magnetic field signal matrix comprising magnetic field signals generated by each of the plurality of current sensors. Generating the coupling matrix may comprise computing the intended coupling factor by dividing the output signal of the respective sensor by the reference current. Generating the coupling matrix may further comprise computing the one or more parasitic coupling factors by dividing the output signal of each of the other ones of the plurality of current sensors by the reference current.

In some embodiments, for each of the plurality of conductors, multiple reference currents can be provided to the conductor and an output signal of the respective current sensor and each of the other ones of the plurality of current sensors can be measured. The coupling matrix can be generated comprising, for each of the plurality of current sensors, an average intended coupling factor indicative of a magnetic coupling between the current sensor and the respective one of the plurality of conductors and one or more average parasitic coupling factors indicative of a magnetic coupling between the respective one of the plurality of conductors and the other ones of the plurality of current sensors.

In another aspect, a current sensor system includes a plurality of means for detecting a magnetic field signal, each positioned proximate to a respective one of a plurality of conductors configured to carry a current to be measured and spaced from one or more other ones of the plurality of conductors and means coupled to each of the plurality of magnetic field detecting means for determining a magnetic coupling between the magnetic field detecting means and each of the plurality of conductors.

In some embodiments, for each magnetic field detecting means, the magnetic coupling determining means is further configured to determine an intended coupling factor indicative of a magnetic coupling between the magnetic field detecting means and the respective conductor and one or more parasitic coupling factors indicative of a magnetic coupling between the magnetic field detecting means and the other ones of the plurality of conductors and is further configured to use the intended coupling factor and the one or more parasitic coupling factors to determine the current in one or more of the plurality of conductors.

The magnetic coupling determining means may comprise a processor configured to generate a coupling matrix comprising the intended coupling factor and the one or more parasitic coupling factors for each of the plurality of magnetic field detecting means. The processor can be further configured to generate an inverse coupling matrix corresponding to an inverse matrix of the coupling matrix. The processor may comprise a multiplier configured to multiply the magnetic field signal from each of the plurality of magnetic field detecting means by the inverse coupling matrix.

BRIEF DESCRIPTION OF THE DRAWINGS

The foregoing features may be more fully understood from the following description of the drawings in which.

DETAILED DESCRIPTION

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall-effect element, a magnetoresistance element, or a magnetotransistor. As is known, there are different types of Hall-effect elements, for example, a planar Hall element, a vertical Hall element, and a Circular Vertical Hall (CVH) element. As is also known, there are different types of magnetoresistance elements, for example, a semiconductor magnetoresistance element such as an Indium Antimonide (InSb) element, a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensing circuit" is used to describe a circuit that uses a magnetic field sensing element, generally in combination with other circuits. Magnetic field sensing circuits are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Figure 1:
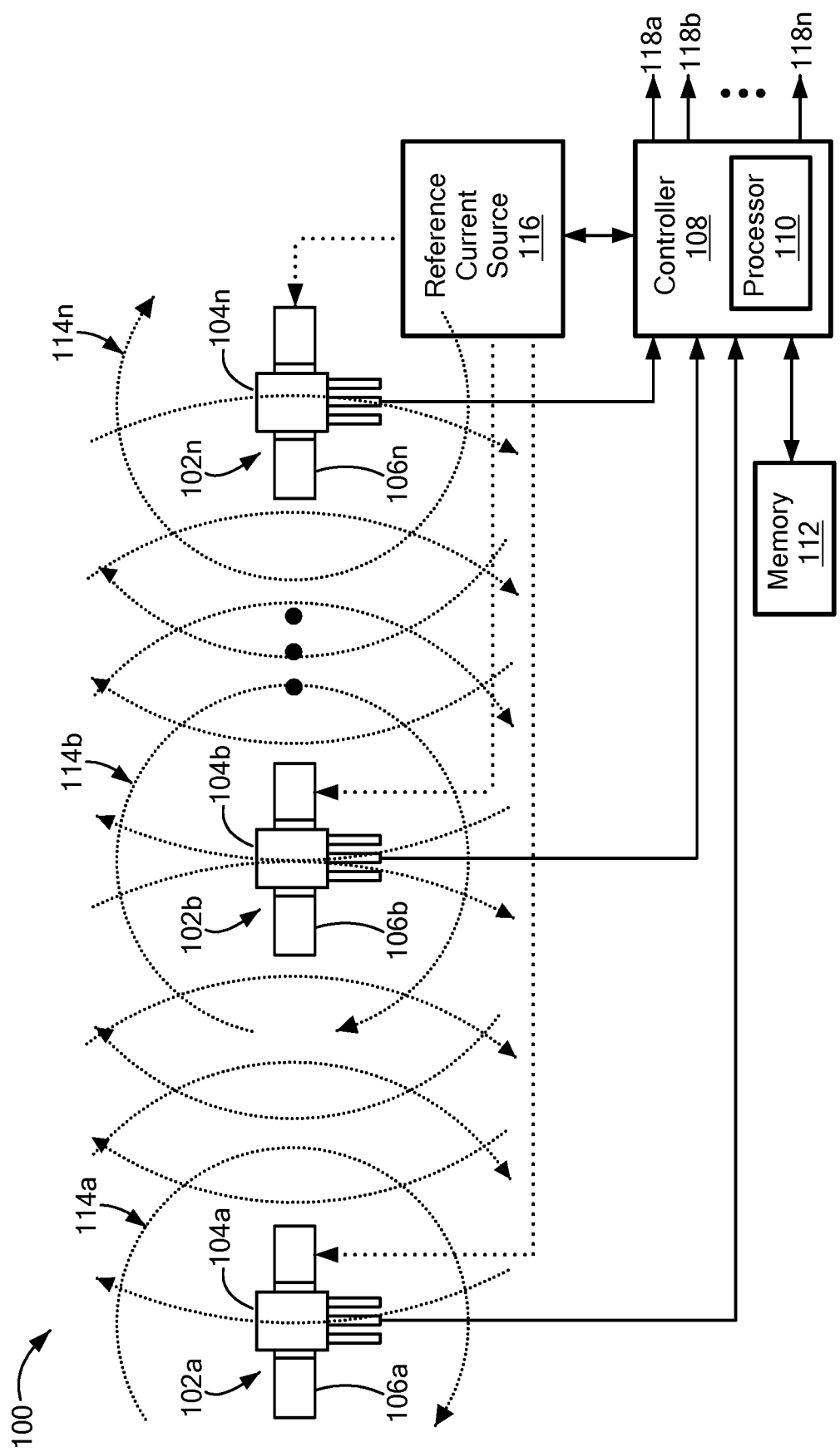
FIG. 1 shows a current sensor system having a plurality of current sensors, each positioned proximate to at least one current carrying conductor.

Now referring to FIG. 1, a current sensor system 100 is provided having a plurality of current sensors 104a-104n and a plurality of conductors 106a-106n, each conductor configured to carry a current to be measured. Each of the current sensors 104a-104n is positioned proximate to at least one of the conductors 106a-106n (e.g., and here proximate to a respective one of the conductors) such that the current sensor can measure the current through the respective conductor 106a-106n. The current sensors 104a-104n are spaced from the other, remaining ones of the plurality of conductors 106a-106n in the current sensor system 100. For example, current sensor 104a is positioned proximate to respective conductor 106a carrying a current intended to be measured by the current sensor 104a and is spaced a predetermined distance from the remaining ones of the plurality of conductors 106b-106n.

Each current sensor and its respective, proximate conductor can be considered to form a current sensor/conductor pairing 102a-102n within the current sensor system 100. Thus, current sensor system 100 may include a plurality a current sensor/conductor pairings.

A conductor (or multiple conductors) that a respective current sensor 104a-104n is paired with may be referred to as an intended conductor (or intended conductors). Although it is desirable for each current sensor to detect only the current through one or more intended current conductors (e.g., through the respective, most proximate current conductor), magnetic coupling can result in a current sensor sensing magnetic field generated not only by current through the intended conductor(s), but also magnetic field generated by current through the unintended, other ones of the plurality of conductors. For example, current sensor 104a is intended to sense the magnetic field 114a attributable only the current through conductor 106a. However, due to magnetic coupling, current sensor 104a may sense magnetic field 114a and 114b and, under such conditions, the output signal of current sensor 104a will not provide an accurate indication of the current through conductor 106a that is intended to be measured.

Each of the current sensors 104a-104n includes one or more magnetic field sensing elements configured to sense a magnetic field 114a-114n generated by a current through one or more of conductors 106a-106n and generate a magnetic field signal indicative of a detected magnetic field 114a-114n. Again, while it is desirable for each current sensor 104a-104n to sense only the magnetic field 114a-114n generated as a result of current flowing through the respective, proximate, intended conductor 106a-106n, magnetic coupling from one or more conductors adjacent to (rather than proximate to) the current sensor may occur. Magnetic field sensing elements may include one or more Hall effect elements and/or magnetoresistance elements. The magnetoresistance element may include at least one of an Indium Antimonide (InSb) element, a giant magnetoresistance (GMR) element, an anisotropic magnetoresistance (AMR) element, a tunneling magnetoresistance (TMR) element or a magnetic tunnel junction (MTJ) element.

Conductors 106a-106 can be coupled to a reference current source 116. Reference current source 116 can generate a reference current and provide the reference current to each of conductors 106a-106. The reference current can be provided to conductors 106a-106n individually. For example, the reference current may be provided to conductors 106a-106n one at a time, such as in a predetermined order or randomly. In some embodiments, reference current source 116 can provide multiple reference currents to each of conductors 106a-106n. For example, in one embodiment, a sequence of reference currents may be provided to each of conductors 106a-106n.

Reference current source 116 may form part of the current sensor system 100. In other embodiments, reference current source 116 may be external to, and thus may be coupled to current sensor system 100 to provide one or more reference currents.

A controller 108 can be coupled to each of current sensors 104a-104n and to the reference current source 116. For example, an output of each of current sensors 104a-104n can be coupled to an input of controller 108. During operational times when the current sensor system 100 is characterizing magnetic coupling within the system, the controller 108 can receive an output signal (e.g., magnetic field signal) from each of current sensors 104a-104n that corresponds to a magnetic field attributable to the reference current provided to conductors 106a-106n. Controller 108 can also control the reference current source 116, such as to establish the reference current level and control the timing and ordering with which the reference current is provided to each of the conductors 106a-106n. During other operational times (e.g., when the conductors 106a-106n carry operational currents associated with normal system operation), the controller 108 can receive an output signal from each of the current sensors 104a-104n that corresponds to a magnetic field attributable to the operational current.

Controller 108 can use the output signals from the current sensors 104a-104n to characterize magnetic coupling between the current sensors 104a-104n and the plurality of conductors 106a-106n. In an embodiment, an intended coupling factor as used herein refers to the magnetic coupling between a current sensor and the one or more intended conductors 106a-106n carrying current intended to be measured by the current sensor. A parasitic coupling factor refers to magnetic coupling between a current sensor and conductors other than the intended conductor(s) (e.g., adjacent or neighboring ones of conductors 106a-106n not coupled to or paired with the current sensor).

Controller 108 may include a plurality of outputs 118a-118n. The number of controller outputs 118a-118n may correspond to the number of current sensors 104a-104n and/or the number of current sensor/conductor pairings 102a-102n. For example, in some embodiments, controller 108 may include an output 118a-118n for each current sensor 104a-104n or for each current sensor/conductor pairing 102a-102n.

In an embodiment, controller 108 may include a processor 110 and a memory 112. In some embodiments, memory 112 may be separate from controller 108 but communicatively coupled to controller 108. In an embodiment, controller 108 may be a computing device (e.g., computer 600 of FIG. 6) configured to receive current sensor output data and determine intended and parasitic magnetic coupling factors within current sensor system 100.

Memory 112 may include a volatile memory and/or a non-volatile memory. For example, the non-volatile memory can store computer instructions, an operating system and/or data for current sensor system 100. The data may include output signals and/or magnetic field signals received from each of current sensors 104a-104n. The data may further include one or more coupling matrices, one or more inverse coupling matrices, intended coupling factor information, parasitic coupling factor information, reference current information, and/or measured current information.

In some embodiments, each of current sensors 104a-104n may include integrated current sensors. For example, one or more magnetic field sensing elements may be provided in the form of an integrated circuit and/or include additional processing circuitry (e.g., circuitry shown in FIG. 3) and can be encapsulated with an electrically insulating material within current sensors 104a-104n. The magnetic field sensing elements and additional circuitry can be formed on a single semiconductor die, which is encapsulated and provided in the form of a single integrated circuit current sensor.

In an alternate embodiment, the magnetic field sensing elements and additional circuitry can be formed on separate semiconductor die coupled with wire bonds or the like in a single or in multiple integrated circuit packages.

Figure 2:
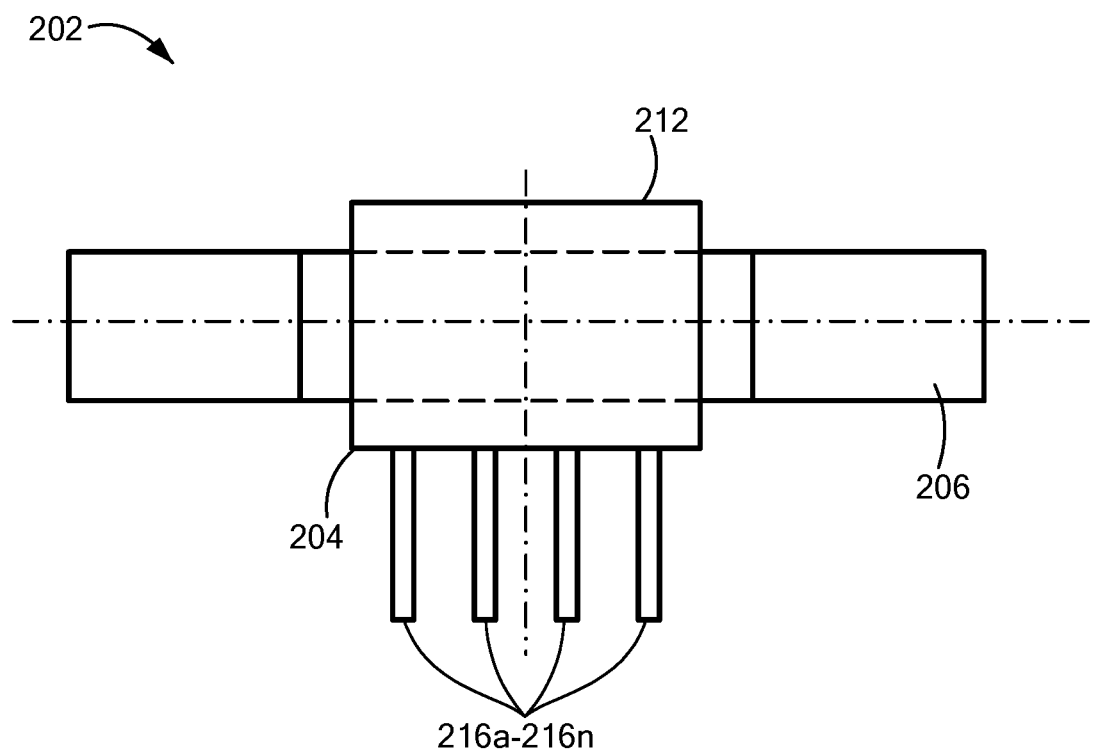
FIG. 2 is a plan view of current sensor positioned proximate to a respective current carrying conductor.

Now referring to FIG. 2, a current sensor and conductor pairing 202 is shown. In an embodiment, FIG. 2 corresponds to one pairing of a current sensor 104a-104n and conductor 106a-016n, as described above with respect to FIG. 1. Current sensor and conductor pairing 202 may include a current sensor 204 positioned proximate to respective conductor 206. The current sensor 204 includes one or more magnetic field sensing elements.

During magnetic coupling characterization, conductor 206 may carry a reference current that generates an associated reference magnetic field and, during normal system operation, conductor 206 may carry a system current intended to be measured in the application in which the sensor is used. Current sensor 204 can detect a magnetic field generated by current through the conductor 206 and generate a corresponding magnetic field signal. Current sensor 204 can generate an output signal based on the magnetic field signal and provide the output signal to a controller (e.g., controller 108 of FIG. 1).

For example, current sensor 204 includes a plurality of leads 216a-216n. One or more of the leads 216a-216n can be coupled to one or more inputs of a controller to provide the output signal from current sensor 204 to the controller. Other ones of the leads may be configured for coupling in a manner shown in connection with the example current sensor of FIG. 3.

In some embodiments, current sensor 204 and thus the one or more magnetic field sensing elements within the current sensor can be positioned within a predetermined distance from conductor 206. For example, current sensor 204 can be positioned such that it is close enough to sense a magnetic field generated by a current through the conductor 206. Thus, the specific spacing between current sensor 204 and conductor 206 may vary based at least in part on the dimensions and relative positions of the current sensor 204 (and its magnetic field sensing elements(s)) and the conductor 206, the sensitivity of the magnetic field sensing element(s) within the current sensor, and/or the level of current intended to be measured.

Current sensor 204 may be coupled to and/or in contact with conductor 206. For example, conductor 206 may include a notch 212 or groove or other indentation or feature configured to receive the current sensor 204. Current sensor 204 and conductor 206 can be in a fixed position relative to each other. For example, current sensor 204 and conductor 206 can be secured to each other in a manner that reduces and/or prevents movement of one relative to the other along at least one of, or a combination of an x-axis, y-axis, or z-axis. The result of this mechanical "interlock" is highly repeatable and tightly controlled current sensor performance.

Conductor 206 may include various types of conductive materials, such as copper. In some embodiments, conductor 206 may be provided in the form of a bus bar or a flat conductor. In some embodiments, a notch 212 or indentation may be formed on conductor 206 to receive the current sensor 204.

It should be appreciated that although FIG. 2 illustrates one sensor 204 paired with one conductor 206, in some embodiments, a current sensor may be paired with or have multiple intended conductors. Further, in some embodiments, one conductor 206 may be paired with multiple current sensors. For example, in one embodiment, one conductor 206 may be paired with multiple current sensors (e.g., two or more current sensors) having different ranges (e.g., fine, coarse ranges). Thus, in an embodiment, the number of current sensors and conductors in a current sensor system may not be equal.

Figure 3:
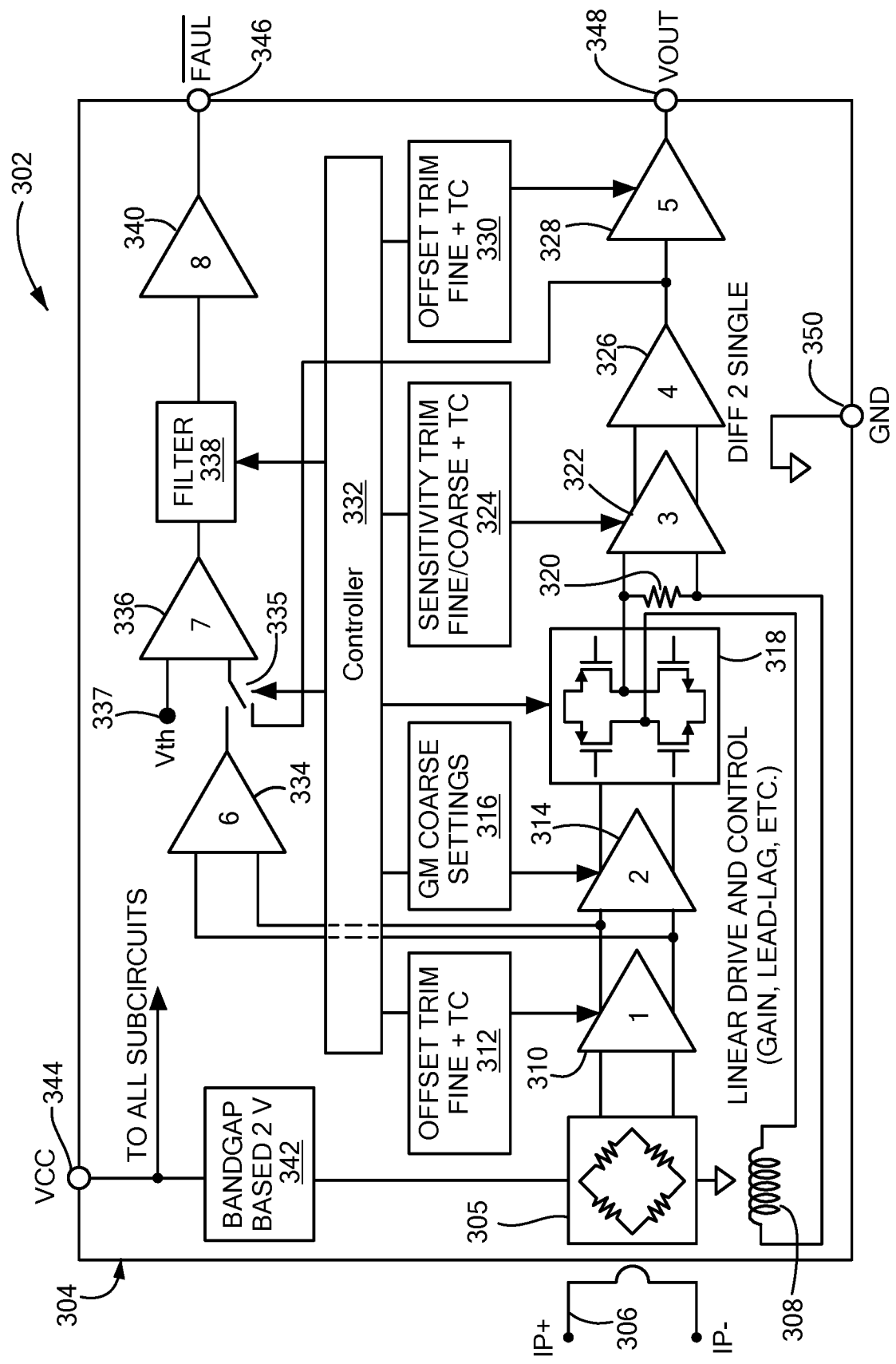
FIG. 3 is a circuit diagram of a current sensor.

Now referring to FIG. 3, a current sensor and conductor pairing 302 includes an example current sensor 304 suitable for use in the current sensor system 100 of FIG. 1. Current sensor 304 includes a magnetic field sensing element 305 and a controller circuit 332. Controller circuit 332 can generate various control signals to control processing the output signal received from magnetic field sensing element 305. For example, controller circuit 332 can provide linearly interpolated temperature compensation, and provide greater accuracy in sensitivity and offset voltage trimming and zero drift temperature drift to reduce a total error of current sensor 304 across the respective operating temperature range.

Controller circuit 332 can include or be coupled to a first offset trim circuit 312, a coarse settings circuit 316, a differential amplifier circuit 318, a sensitivity trim circuit 324, a second offset trim circuit 330, a switch 335 and a filter 338. Each of the circuits can be controlled to modify an output of current sensor 304 to generate an output signal having high accuracy and compensate for changes in sensor performance due to temperature. For example, controller circuit 332 can be configured to provide temperature compensation within a predetermined accuracy threshold across the temperature operating range of the current sensor 304. Further, controller circuit 332 can reduce the sensitivity and offset drift of the magnetic field sensing element 305.

Output voltage clamps can provide short-circuit diagnostic capabilities. For example, current sensor 304 can include a clamped low-impedance output stage.

In operation, conductor 306 carries a current, for example a current provided by a reference current source during operational times when magnetic coupling within the current sensor system is being characterized or a current provided in the current sensor system application during normal operation. Current sensor 304 is positioned proximate to respective, intended conductor 306 to sense a magnetic field generated by the current through conductor 306. Current sensor 304 can generate an output signal at output terminal 348 corresponding to the sensed current.

Conductor 306 can be disposed a predetermined distance from a magnetic field sensing element 305 within current sensor 304. Magnetic field sensing element 305 is configured to sense the magnetic field generated by current through conductor 306 and generate a magnetic field signal corresponding to the sensed current.

In the example current sensor 304 of FIG. 3, magnetic field sensing element 305 is provided as a magnetoresistance element having four resistive elements in a bridge configuration, such as a Wheatstone bridge. For example, magnetoresistance element 305 may be positioned such that at least two resistive elements sense a magnetic field corresponding to the current through conductor 306 in a first direction and at least two resistive different elements sense a magnetic field corresponding to the current through conductor 306 in a second direction. A difference between the magnetic field sensed in the first direction and the magnetic field sensed in the second direction may result in a differential field signal that rejects stray fields around current sensor 304. The magnetoresistance element 305 may include at least one of at least one of an Indium Antimonide (InSb) element, a giant magnetoresistance (GMR) element, an anisotropic magnetoresistance (AMR) element, a tunneling magnetoresistance (TMR) element or a magnetic tunnel junction (MTJ) element.

It should be appreciated that although magnetic field sensing element 305 is provided as a magnetoresistance element, in some embodiments, magnetic field sensing element 305 may be provided as a one or more Hall effect elements.

A voltage source terminal 344 can be coupled to a bandgap circuit 342. Bandgap circuit 342 can be coupled to magnetic field sensing element 305 to provide a temperature independent voltage.

Magnetic field sensing element 305 can generate a magnetic field signal and provide the magnetic field signal to a first amplifier 310. An offset trim control circuit 312 can be configured to trim one or more current sensor parameters. For example, offset trim control circuit 312 can generate and provide an offset trim signal to first amplifier 310 to adjust a sensitivity and/or an operating voltage of the first amplifier 310. The offset trim signal may include an offset value to reduce an offset (e.g., DC offset) of magnetic field signal received from magnetic field sensing element 305. In some embodiments, the offset value may be based at least in part on the characteristics of magnetic field sensing element 305.

One or more outputs of first amplifier 310 are coupled to one or more inputs of a second amplifier 314 and a sixth amplifier 334. A coarse settings circuit 316 can be coupled to second amplifier 314. The coarse settings circuit 316 can be configured to provide a settings signal to second amplifier 314 to modify properties of a received signal.

One or more outputs of second amplifier 314 are coupled to differential amplifier circuit 318. Differential amplifier circuit 318 can include multiple field effect transistors coupled together to compare two input signals and remove or reduce noise and/or interference (e.g., DC offset) and in some embodiments, apply a gain to the difference between the two input signals. Differential amplifier circuit 318 can be coupled to an inductive feedback element 308. The inductive feedback element 308 can be positioned proximate to magnetic field sensing element 305 in order to apply an equal and opposite field to the sensing element 305 to thereby implement a closed loop current sensing system. It should be appreciated that although current sensor 304 is shown to be a closed loop sensor in FIG. 3, in some embodiments, current sensor 304 can be an open loop sensor.

An output of differential amplifier circuit 318 is coupled to a third amplifier 322. Third amplifier 322 can have a second input coupled to inductor 308. In some embodiments, a resistive element 320 is coupled between the first and second inputs of third amplifier 322.

A sensitivity trim circuit 324 can be coupled to third amplifier 322. Sensitivity trim circuit 324 can generate and provide a sensitivity trim signal to third amplifier 322 to adjust a sensitivity and/or an operating voltage of third amplifier 322. One or more outputs of third amplifier 322 can be coupled to one or more inputs of a fourth amplifier 326.

The output of fourth amplifier 326 can be coupled to a fifth amplifier 328 and a switch 335 that couples fourth amplifier 326 to a seventh amplifier 336. An offset trim circuit 330 can be coupled to fifth amplifier 328. Offset trim circuit 330 can generate and provide an offset trim signal to fifth amplifier 328 to adjust a sensitivity and/or an operating voltage of fifth amplifier 328.

An output of fifth amplifier 328 can be coupled to an output terminal of current sensor circuit 304 (e.g., VOUT).

Sensor output terminal 348 can be coupled to a system controller (e.g., controller 108 of FIG. 1) and provide a magnetic field signal indicative of a detected magnetic field to the controller for processing.

An output of sixth amplifier 334 can be coupled to switch 335 that coupled sixth amplifier 334 to seventh amplifier, or comparator 336. Thus, depending on a position of switch 335, a first input of comparator 336 can be coupled to receive an output signal from fourth amplifier 326 or sixth amplifier 334. In some embodiments, switch 335 is controlled by controller 332.

A second input of comparator 336 is coupled to a threshold voltage 337. An output of comparator 336 is coupled to an input of a filter 338. Controller 332 can be coupled to filter 338 to provide a control signal to control the filtering of the output signals from seventh amplifier 326.

An output of filter 338 is coupled to an input of eighth amplifier 340. An output of eighth amplifier 340 is coupled to a fault terminal 346 (e.g., FAULT pin) of current sensor 304. Fault terminal 346 can be used to detect a high magnetic field condition. For example, fault terminal 346 can be configurable and can include a self-test feature that can be activated by controller circuit 332 or a user. Sensing circuit includes a ground terminal 350.

Figure 4:
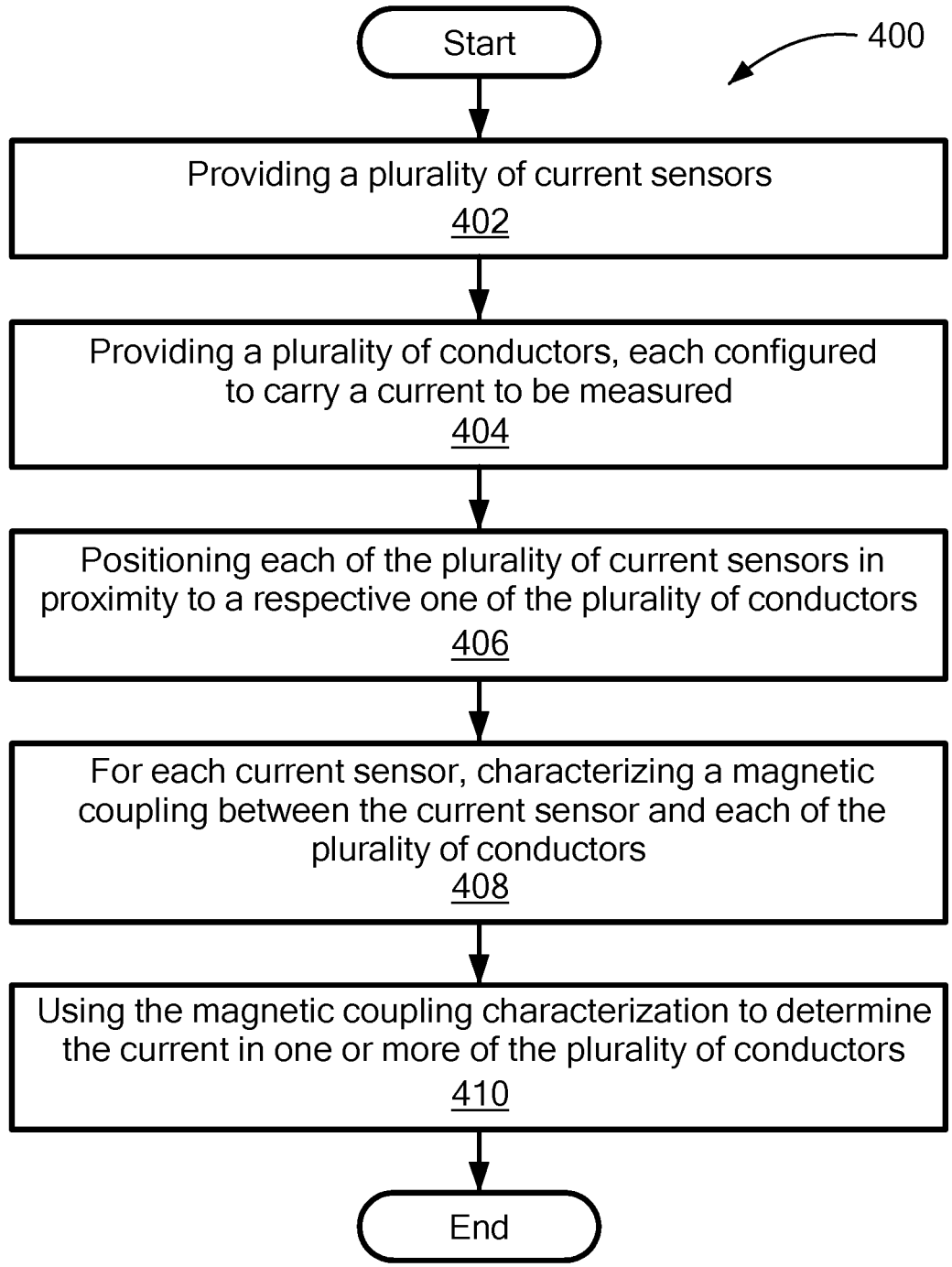
FIG. 4 is a flow diagram of a method for determining a current in one or more conductors of the current sensor system of FIG. 1.

Now referring to FIG. 4, a method for determining a current in one or more of a plurality of conductors in a multi-conductor current sensor system begins at block 402, by providing a plurality of current sensors. At block 404, a plurality of conductors are provided, each of the conductors configured to carry a current to be measured.

At block 406, each of the plurality of current sensors is positioned in proximity to a respective one (or in some embodiments more than one) of the plurality of conductors carrying a current intended to be measured by the current sensor and is spaced from the other ones of the plurality of conductors. Proximity as used herein may refer to a respective conductor positioned nearest to a respective current sensor as compared with the other remaining conductors of the plurality of conductors. In some embodiments, proximity may refer to multiple conductors positioned nearest to a respective current sensor as compared with the other remaining conductors of the plurality of conductors. Thus, each current sensor can be positioned in proximity to one or more conductors and spaced from the other remaining conductors of the plurality of conductors.

In some embodiments, proximity may refer to one or more conductors coupled to or otherwise in contact with a respective current sensor as compared with the other remaining conductors of the plurality of conductors. For example, one or more of the current sensors can be coupled to (e.g., in contact with) one or more conductors.

Thus, each current sensor can be paired up with one or more conductors to form a current sensor/conductor pair, whereby the pair includes a current sensor and the one or more proximately positioned conductors.

Each current sensor can be configured to sense a current through the respective conductor or multiple conductors it is paired with and generate an output signal (e.g., output voltage) corresponding to the sensed current. For example, each current sensor can include one or more magnetic field sensing elements configured to sense a magnetic field induced by the current flowing through a respective conductor and generate a voltage in the form of a magnetic field signal that is proportional to the sensed magnetic field.

However, in some applications, the plurality of conductors can be positioned close enough such that magnetic coupling from adjacent conductors (e.g., neighboring conductors that a current sensor is not paired with) can impact the ability of a current sensor, and thus the magnetic field sensing element, to accurately sense and measure the current through the respective, intended conductor that it is paired with. Thus, the detected magnetic field and corresponding generated magnetic field signal may include an intended magnetic coupling from a respective one of the plurality of conductors that the current sensor is positioned in proximity to and one or more parasitic magnetic couplings from the remaining ones of the plurality of conductors.

Starting at block 408, the magnetic coupling from adjacent conductors can be determined and used to compensate for the unwanted coupling. At block 408, for each current sensor, a magnetic coupling between the current sensor and each of the plurality of conductors is characterized. To determine the magnetic coupling between a current sensor and each of the conductors, a reference current can be provided to each of the conductors in the current sensor system. This may be referred to as a characterization measurement. The reference current can be provided to each of the conductors individually or to a group of conductors simultaneously and the outputs from each of the current sensors in the current sensor system can be measured simultaneously or sequentially or the outputs from a subset of current sensors in the current sensor system can be measured (e.g., not all of the current sensors in the current sensor system).

For example, the reference current can be provided to a first conductor at a first time period, to a second conductor at a second time period and to a third conductor at a third time period. At each time period, the output at each of the current sensors can be measured. For example, at the first time period, the output at each of the current sensors is responsive to the reference current provided to the first conductor, at the second time period, the output at each of the current sensors is responsive to the reference current provided to the second conductor, and at the third time period, the output at each of the current sensors is responsive to the reference current provided to the third conductor.

As the reference current is provided to each of the conductors, the conductors can generate a magnetic field that is sensed by magnetic field sensing elements of each of the current sensors. The magnetic field sensing elements can generate a magnetic field signal corresponding to the sensed field. The current sensor includes additional circuitry (e.g., as illustrated in FIG. 3) to receive the magnetic field signal and generate an output signal (e.g., output voltage) corresponding the sensed magnetic field.

The reference current may be provided at a predetermined level that is sufficiently high current to allow a resulting magnetic field to be detected by each of the current sensors in the system. Thus, the level of the reference current may be based at least in part on the types, dimensions, and properties of the conductors and/or the current sensors.

An intended coupling factor as used herein refers to the magnetic coupling between a current sensor and the conductor to which it is coupled to or paired with in a current sensor system (i.e., the conductor(s) carrying the current that the respective current sensor is intended to measure). A parasitic coupling factor refers to the magnetic coupling between the current sensor and or neighboring conductor that is not coupled to or paired the current sensor (i.e., not the conductor carrying the current that the current sensor is intended to measure).

In some embodiments, the coupling factors can be determined by dividing the current sensor output signal by the reference current. For example, the characterization measurement yields an intended coupling factor $$\left(e.g., k_n = \frac{U_n}{I_n}\right)$$

and one or more parasitic coupling factors $$\left(e.g., k_{pnm} = \frac{U_{npnm}}{I_{pnm}}\right),$$

where I represents the current provided to the respective conductor, $k_n$ represents the coupling factor for an intended conductor, $k_{pn}$ represents the coupling factor for a parasitic conductor, and U represents the measured output of the current sensor. The intended coupling and parasitic coupling factors can be provided in units of sensor output voltage per conductor current (e.g., mV/A).

The characterization measurement can be repeated for each of the conductors in the current sensor system. The characterization measurement can be performed by a controller (e.g., controller 108 of FIG. 1) coupled to each of the current sensors. The controller can receive an output signal, responsive to the reference current provided to each of the conductors, from each of the current sensors.

The controller can generate a coupling matrix comprising the intended coupling factor and one or more parasitic coupling factors for each of the current sensors. For example, in an embodiment having n conductors, the relation between conductor currents and current sensor outputs can be provided by the following matrix equation:

$$\begin{pmatrix} k_1 & k_{p12} & \cdots & k_{p1n} \\ k_{p21} & k_2 & \cdots & k_{p2n} \\ \vdots & \vdots & \ddots & \vdots \\ k_{pn1} & k_{pn2} & \cdots & k_n \end{pmatrix} \begin{pmatrix} I_1 \\ I_2 \\ \vdots \\ I_n \end{pmatrix} = \begin{pmatrix} U_1 \\ U_2 \\ \vdots \\ U_n \end{pmatrix}$$

where I represents the current through a respective conductor, $k_n$ represents the coupling factor for an intended conductor, $k_{pn}$ represents the coupling factor for a parasitic conductor, and U represents the measured output of a current sensor. In the above matrix equation, a matrix containing the currents provided to each of the n conductors can be multiplied by the coupling matrix containing the intended coupling factors and parasitic coupling factors to provide a matrix containing the measured outputs of each of the current sensors.

As provided in the above matrix equation, the intended coupling factors and parasitic coupling factors form a coupling matrix, K, represented as follows:

$$K = \begin{pmatrix} k_1 & k_{p12} & \cdots & k_{p1n} \\ k_{p21} & k_2 & \cdots & k_{p2n} \\ \vdots & \vdots & \ddots & \vdots \\ k_{pn1} & k_{pn2} & \cdots & k_n \end{pmatrix}$$

The coupling matrix includes a plurality of columns and rows, for example with the number of columns corresponding to the number of conductors in the current sensor system and the number of rows corresponding to the number of current sensors a in the current sensor system. For example, each row and column of the coupling matrix may include at least one entry for an intended coupling factor for an intended conductor and one or more entries for parasitic coupling factors for the remaining conductors in the current sensor system. Thus, the size of the coupling matrix may vary based at least on the number of current sensors and/or the number of conductors in a particular current sensor system.

In an embodiment, if only one conductor current is non-zero, the respective intended coupling factor $k_n$ and the one or more parasitic coupling factors $k_{pnm}$ for the adjacent conductors can be determined. Thus, to calibrate a current sensor system, one conductor current can be set to a non-zero reference current and the remaining conductor currents can be forced to zero to determine the coupling factors. For example, for $I_1 \neq 0$ and $I_2$ through $I_n=0$, the resulting relation between conductor currents and current sensor outputs can be provided by the following matrix:

$$\begin{pmatrix} k_1 & k_{p12} & \cdots & k_{p1n} \\ k_{p21} & k_2 & \cdots & k_{p2n} \\ \vdots & \vdots & \ddots & \vdots \\ k_{pn1} & k_{pn2} & \cdots & k_n \end{pmatrix} \begin{pmatrix} I_1 \\ 0 \\ \vdots \\ 0 \end{pmatrix} = \begin{pmatrix} U_1 \\ U_2 \\ \vdots \\ U_n \end{pmatrix}$$

with $k_1 = \frac{U_1}{I_1}$, $k_{p21} = \frac{U_2}{I_1}$ and $k_{pn1} = \frac{U_n}{I_1}$.

The coupling matrix K can be inverted to generate an inverse coupling matrix, $K^{-1}$. The inverse coupling matrix $K^{-1}$ can be generated by the same controller that generates the coupling matrix K (e.g., controller 108 of FIG. 1). Alternatively, the inverse coupling matrix $K^{-1}$ can be generated by a separate controller that is part of or external to the current sensor system.

To invert the coupling matrix, various techniques can be used as is known, including but not limited to: Gaussian elimination, Cayley-Hamilton method, Eigen decomposition, Cholesky decomposition, etc. In some embodiments, the coupling matrix can be inverted using an identity matrix.

The identity matrix can be represented as follows:

$$\text{Identity} = \begin{pmatrix} 1 & 0 & \cdots & 0 \\ 0 & 1 & \cdots & 0 \\ \vdots & \vdots & \ddots & \vdots \\ 0 & 0 & \cdots & 1 \end{pmatrix}$$

Using the identity matrix, the coupling matrix can be converted into a double-wide matrix having the coupling matrix on one side (here left) and the identity matrix on the other side (here right):

$$\text{Double-Wide} = \left[ \begin{pmatrix} k_1 & k_{p12} & \cdots & k_{p1n} \\ k_{p21} & k_2 & \cdots & k_{p2n} \\ \vdots & \vdots & \ddots & \vdots \\ k_{pn1} & k_{pn2} & \cdots & k_n \end{pmatrix} \begin{pmatrix} 1 & 0 & \cdots & 0 \\ 0 & 1 & \cdots & 0 \\ \vdots & \vdots & \ddots & \vdots \\ 0 & 0 & \cdots & 1 \end{pmatrix} \right]$$

Matrix row operations can be performed to convert the left side of the double-wide matrix into the identity. For example, the controller may include a processor having a multiplier to perform the matrix row operations.

Now that the left-hand side of the double-wide matrix contains the identity, the right-hand side contains the inverse coupling matrix, $K^{-1}$. In some embodiments, the inverse coupling matrix can be confirmed by multiplying the coupling matrix by the inverse coupling matrix which should provide the identity matrix.

The magnetic coupling characterization can be performed once for a given multi-conductor system design, particularly in applications with relatively large distances between conductors and respective sensors since sensitivity to misplacement is relatively low in such applications. Alternatively however, it will be appreciated that the magnetic coupling characterization can be performed more than once.

At block 410, the magnetic coupling characterization can be used to determine the current in one or more of the plurality of conductors. In an embodiment, a matrix equation can be generated (e.g., by the controller 108), using the inverse coupling matrix, to determine the currents in each of the conductors. For example, the following matrix equation can be generated to represent the relationship between measured currents I and measured current sensor outputs U using the inverse coupling matrix, $K^{-1}$:

$$\begin{pmatrix} I_1 \\ I_2 \\ \vdots \\ I_n \end{pmatrix} = K^{-1} \begin{pmatrix} U_1 \\ U_2 \\ \vdots \\ U_n \end{pmatrix}$$

The above matrix equation can be used (e.g., by controller processor 110) to determine the current in one or more of the conductors using the inverse coupling matrix $K^{-1}$ and the outputs $U_1$-$U_n$ of the current sensors.

In some embodiments, the current through one or more of conductors can be determined based on the currents through each of the other conductors. In this case, during the magnetic coupling characterization, the output of one of the current sensors in the system need not be measured. For example in certain current sensor system applications, the sum of all the currents provided to a load can be zero. In such an embodiment, the coupling matrix and corresponding inverse coupling matrix can be determined using the known relationship between the currents through all of the conductors.

For example, in an application having three conductors (in which the sum of the conductor currents during system operation is zero) with the output of the middle current sensor missing, the relationship between the currents can be represented by the following equations:

$I_1+I_2+I_3=0$, where $I_2=-I_1-I_3$

The missing current, $I_2$, can be substituted with $-I_1-I_3$ in the matrix equation. Thus, the matrix equation reduces to:

$$\begin{pmatrix} k_1 - k_{p12} & k_{p13} - k_{p12} \\ k_{p31} - k_{p32} & k_3 - k_{p32} \end{pmatrix} \begin{pmatrix} I_1 \\ I_3 \end{pmatrix} = \begin{pmatrix} U_1 \\ U_3 \end{pmatrix}$$

Thus, a coupling matrix, K, can be represented as follows:

$$K = \begin{pmatrix} k_1 - k_{p12} & k_{p13} - k_{p12} \\ k_{p31} - k_{p32} & k_3 - k_{p32} \end{pmatrix}$$

The above coupling matrix can be inverted using the same techniques described above to provide an inverse coupling matrix. The inverse coupling matrix can provide equations for $I_1$ and $I_3$. Thus, $I_2$ can be determined using the equation $I_2=-I_1-I_3$.

Figure 5:
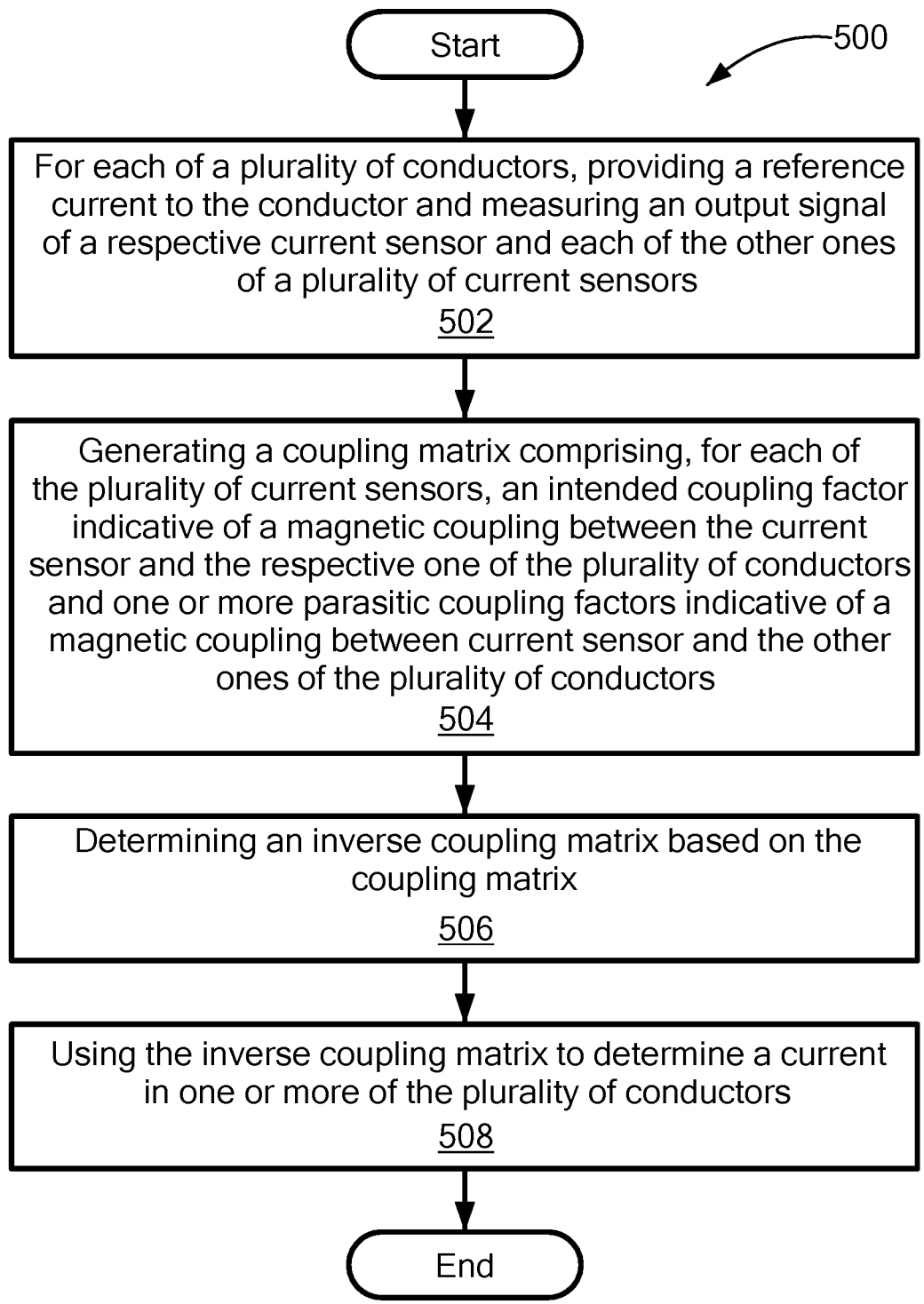
FIG. 5 is a flow diagram of a method for determining a current in one or more conductors of the current sensor system of FIG. 1.

Now referring to FIG. 5, a method 500 for determining a current in one or more conductors of a multi-conductor current sensor system is shown. The method 500 corresponds generally to blocks 408 and 410 of FIG. 4. The magnetic coupling characterization begins at block 502 by providing a reference current to a conductor and measuring an output signal of a respective current sensor and each of the other ones of a plurality of current sensors. Block 502 is repeated for each of the plurality of conductors.

To determine a coupling factor for each of the conductors, a reference current can be provided to each of the conductors individually and then an output, responsive to the reference current being provided to a respective conductor, can be measured individually at each of the current sensors. This measurement may be referred to as a characterization measurement as it provides a characterization of the magnetic coupling effect of a respective conductor with respect to each of the plurality of current sensors.

In some embodiments, multiple reference currents (e.g., a sequence of currents) may be provided to each of the conductors individually and then an output, responsive to the multiple reference currents being provided to a respective conductor, can be measured individually at each of the current sensors. In such an embodiment, a total or average coupling factor can be determined. For example, in one embodiment, a first current having a positive value and a second current having a negative value may be provided to each of the conductors to determine an average coupling factor.

The reference current can be provided to each of the conductors sequentially, in a predetermined order. In other embodiments, the reference current can be provided to each of the conductors randomly.

For each conductor, a measurement is taken at the output for each of the current sensors, responsive to the current being provided to the respective conductor. Thus, for each conductor, the number of measurements taken can correspond to the number of current sensors in the current sensor system.

The reference current can be generated and provided by a reference current source coupled to each of the conductors. The reference current source may include various circuitry disposed within the current sensor system and configured to generate a current.

The level (e.g., strength) of the reference current can be sufficiently high that when the reference current is provided to a conductor, the conductor generates a magnetic field strong enough that each of the current sensors in the current sensor system can sense the magnetic field generated by the respective conductor.

In some embodiments, each of the current sensors can generate an output signal corresponding to a sensed magnetic field. For example, each current sensor includes a magnetic field sensing element that can sense the magnetic field generated by the respective conductor and generate a magnetic field signal corresponding to the sensed or detected magnetic field.

The output of each of the current sensors can be coupled to a controller. The controller can receive an output signal from each of the current sensors corresponding to the sensed magnetic field. The controller can store each of the received output signals from each of the current sensors. For example, the controller may include a memory device. The memory may include, but not be limited to, a database, one or more look-up tables for storing and organizing captured data from one or more current sensors, collected by a controller of a respective current sensor, as well as any tables or matrices (e.g., coupling matrix, inverse coupling matrix) generated using the captured data. In some embodiments, the controller can be coupled to the memory device.

At block 504, a coupling matrix can be generated comprising, for each of the plurality of current sensors, an intended coupling factor indicative of a magnetic coupling between the current sensor and the respective one of the plurality of conductors and one or more parasitic coupling factors indicative of a magnetic coupling between the current sensor and other ones of the plurality of conductors.

In an embodiment, the controller can generate a coupling matrix containing intended coupling factors and parasitic coupling factors for each of the current sensors in the current sensor system. For example, in an embodiment having n conductors, the relation between conductor currents and current sensor outputs can be provided by the following matrix equation:

$$\begin{pmatrix} k_1 & k_{p12} & \cdots & k_{p1n} \\ k_{p21} & k_2 & \cdots & k_{p2n} \\ \vdots & \vdots & \ddots & \vdots \\ k_{pn1} & k_{pn2} & \cdots & k_n \end{pmatrix} \begin{pmatrix} I_1 \\ I_2 \\ \vdots \\ I_n \end{pmatrix} = \begin{pmatrix} U_1 \\ U_2 \\ \vdots \\ U_n \end{pmatrix}$$

In the above matrix equation, a matrix containing the currents provided to each of the n conductors can be multiplied by the coupling matrix containing the intended coupling factors and parasitic coupling factors to provide a matrix containing the measured outputs of each of the current sensors.

The coupling matrix is made up of the intended coupling factors and parasitic coupling factors and can be represented as by the following matrix:

$$K = \begin{pmatrix} k_1 & k_{p12} & \cdots & k_{p1n} \\ k_{p21} & k_2 & \cdots & k_{p2n} \\ \vdots & \vdots & \ddots & \vdots \\ k_{pn1} & k_{pn2} & \cdots & k_n \end{pmatrix}$$

The coupling matrix includes a plurality of columns and rows, for example with the number of columns corresponding to the number of conductors in the current sensor system and the number of rows corresponding to the number of current sensors a in the current sensor system. For example, each row and column of the coupling matrix may include at least one entry for an intended coupling factor for an intended conductor and one or more entries for parasitic coupling factors for the remaining conductors in the current sensor system. Thus, the size of the coupling matrix may vary based at least on the number of current sensors and/or the number of conductors in a particular current sensor system.

As explained above, the intended coupling factor can be determined by dividing the output signal of a respective current sensor by the reference current. The parasitic coupling factor can be determined by dividing an output signal from one of the remaining current sensors of the plurality of current sensor (e.g., not the respective current sensor) by the reference current.

In some embodiments, the coupling matrix can be generated having one or more average intended coupling factors and one or more average parasitic coupling factors. For example, if multiple reference currents are provided to each of the conductors, an average coupling matrix can be generated having average intended coupling factors and average parasitic coupling factors.

In an embodiment, the coupling matrix may be generated by a remote or external computing device that is remote and/or external to the controller and/or the current sensor system. For example, the controller may be communicatively coupled to the remote computing device and can transmit the output signals received from each of the current sensors to the remote computing device.

At block 506, an inverse coupling matrix can be determined based on the coupling matrix. In an embodiment, the inverse coupling matrix can be determined using a variety of techniques, including but not limited to the: Gaussian elimination, Cayley-Hamilton method, Eigen decomposition, Cholesky decomposition, etc. In some embodiments, the coupling matrix can be inverted using an identity matrix as described above with respect to method 400.

The coupling matrix can be inverted to generate the inverse coupling matrix $K^{-1}$. For example, having the coupling factors, the inverse coupling matrix $K^{-1}$ can be determined leading to a matrix equation that yields the conductor currents when all of the outputs of the current sensors are known.

At block 508, the inverse coupling matrix can be used to determine a current in one or more of the plurality of conductors. In an embodiment, a matrix equation can be generated for the relationship between the conductor currents, the inverse coupling matrix, and the output signals from each of the current sensors. The matrix equation can be represented as follows:

$$\begin{pmatrix} I_1 \\ I_2 \\ \vdots \\ I_n \end{pmatrix} = K^{-1} \begin{pmatrix} U_1 \\ U_2 \\ \vdots \\ U_n \end{pmatrix}$$

In an embodiment, having all the coupling factors, the above matrix equation can be used to determine conductor currents for each of the conductors by measuring the outputs at each of the current sensors. For example, the measured current sensor outputs can be multiplied by the inverse coupling matrix to determine each of the conductor currents.

In some embodiments, the current at one or more of conductors can be determined based on the currents at each of the other conductors. For example, in applications in which the sum of all the currents provided to the load is zero, the coupling matrix and corresponding inverse coupling matrix can be determined using the relationship between the currents provided to all of the conductors.

For example, in an embodiment having three conductors carrying currents that sum to zero, with the current from the second conductor missing, the relationship between the currents can be represented by the following equations:

$$I_1 + I_2 + I_3 = 0, \text{ where } I_2 = -I_1 - I_3$$

The missing current, $I_2$, can be substituted with $-I_1-I_3$ in the matrix equation. Thus, the matrix equation reduces to:

$$\begin{pmatrix} k_1 - k_{p12} & k_{p13} - k_{p12} \\ k_{p31} - k_{p32} & k_3 - k_{p32} \end{pmatrix} \begin{pmatrix} I_1 \\ I_3 \end{pmatrix} = \begin{pmatrix} U_1 \\ U_3 \end{pmatrix}$$

Thus, a coupling matrix, K, can be represented as follows:

$$K = \begin{pmatrix} k_1 - k_{p12} & k_{p13} - k_{p12} \\ k_{p31} - k_{p32} & k_3 - k_{p32} \end{pmatrix}$$

The above coupling matrix can be inverted using the same techniques described above to provide an inverse coupling matrix. The inverse coupling matrix can provide equations for $I_1$ and $I_3$. Thus, $I_2$ can be determined using the equation $I_2 = -I_1 - I_3$.

Figure 6:
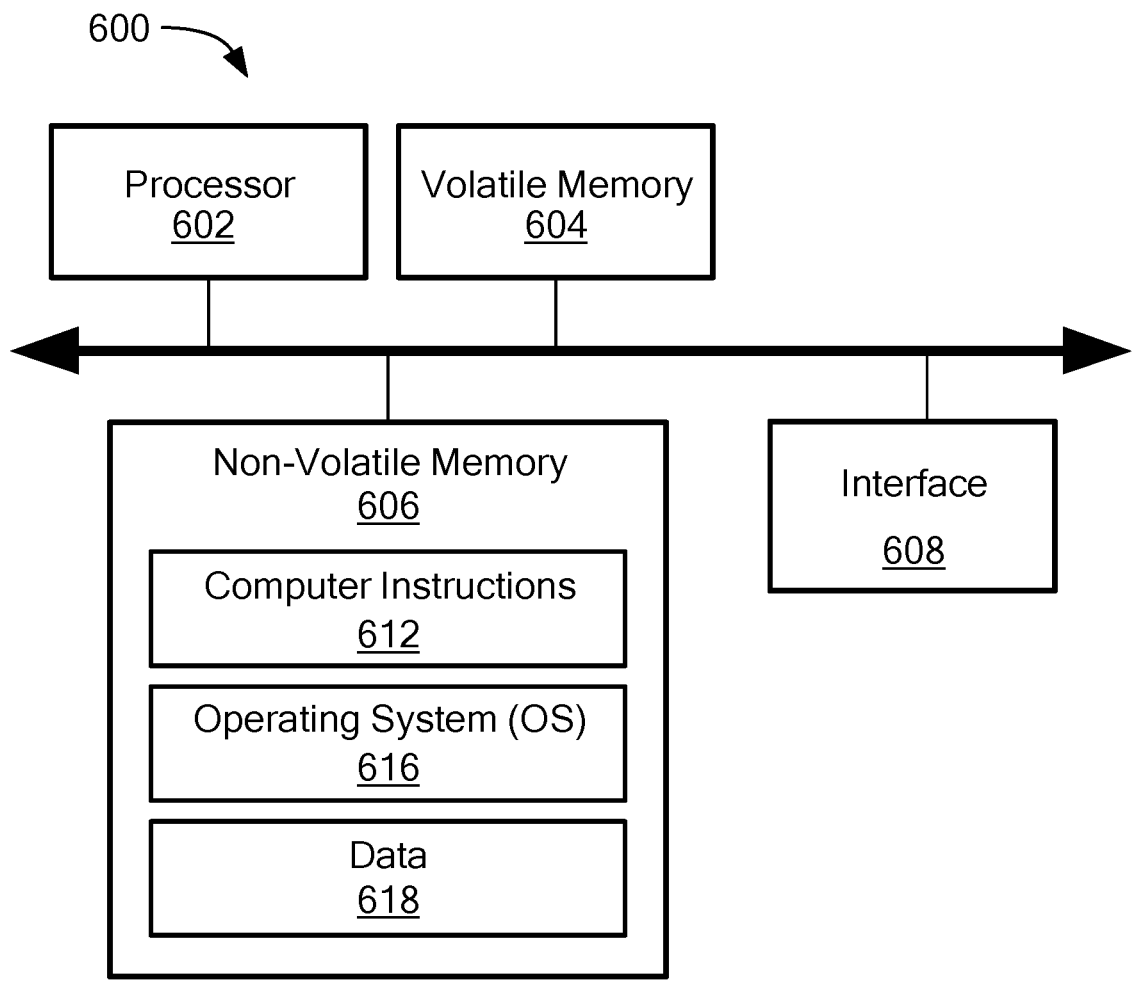
FIG. 6 is a block diagram of an embodiment of a processing system for determining a current in one or more conductors of the current sensor system of FIG. 1 with the techniques described herein.

Referring now to FIG. 6, a computer 600 includes a processor 602, a volatile memory 604, a non-volatile memory 606 (e.g., hard disk), and an interface 608 (e.g., a mouse, a keyboard, a display, for example). The non-volatile memory 606 stores computer instructions 612, an operating system 616 and data 618. In an embodiment, the data 618 may include data output signals from a current sensor, reference current information, measured current information, intended coupling factors, parasitic coupling factors, coupling matrix data, inverse coupling matrix data.

In some embodiments, non-volatile memory 606 may include one or more look-up tables for storing and organizing captured data from one or more current sensors, collected by a controller of a respective current sensor, as well as any tables or matrices (e.g., coupling matrix, inverse coupling matrix) generated using the captured data. In one example, the computer instructions 612 are executed by the processor 602 out of volatile memory 604 to perform all or part of the method (or process) 400 of FIG. 4, and/or method (or process) 500 of FIG. 5.

In an embodiment, computer 600 may be the same as or substantially similar to components of current sensor system 100, such as controller 108, processor 110 and memory 112. Computer 600 may perform all of the same functions and be configured to receive and generate the same data as each of the components of current sensor system 100, such as controller 108, processor 110 and memory 112. For example, computer 600 may be configured to collect output signals corresponding to measured magnetic fields generated by one or more conductors in response to an applied reference current, and generate one or more coupling matrices and inverse coupling matrices.

Methods 400 and 500 are not limited to use with the hardware and software of FIG. 6; they may find applicability in any computing or processing environment and with any type of machine or set of machines that are capable of running a computer program and/or performing the necessary numerical calculations. Methods 400 and 500 may be implemented in hardware, software, or a combination of the two. Methods 400 and 500 may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform methods 400 and 500 and to generate output information.

The system may be implemented, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. Alternatively, the system may be implemented, at least in part, as firmware.

A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer to perform methods 400 and 500. Methods 400 and 500 may also be implemented as a machine-readable storage medium, configured with a computer program, where upon execution, instructions in the computer program cause the computer to operate in accordance with methods 400 and 500.

Methods 400 and 500 may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

What is claimed is:

1. A current sensor system comprising:
a plurality of current sensors, each positioned proximate to a respective one of a plurality of conductors configured to carry a current to be measured and spaced from one or more other ones of the plurality of current sensors, each current sensor comprising one or more magnetic field sensing elements configured to generate a respective magnetic field signal indicative of a detected magnetic field, wherein the plurality of current sensors comprises a first number of current sensors and wherein the plurality of conductors comprises a second number of conductors and wherein the first number and the second number are equal; and
a controller comprising a processor, the controller coupled to receive the magnetic field signal from each of the plurality of current sensors and, for each current sensor, configured to characterize a magnetic coupling between the current sensor and each of the plurality of conductors, the controller configured to:
determine (i) an intended coupling factor indicative of a magnetic coupling between each of the plurality of current sensors and the respective one of the plurality of conductors and (ii) one or more parasitic coupling factors indicative of a magnetic coupling between the respective one of the plurality of conductors and the other ones of the plurality of current sensors;

generate a coupling matrix comprising the intended coupling factor and the one or more parasitic coupling factors for each of the plurality of current sensors; and use the coupling matrix to determine the current in one or more of the plurality of conductors.

2. The current sensor system of claim 1 wherein the processor is further configured to generate an inverse coupling matrix corresponding to an inverse matrix of the coupling matrix.

3. The current sensor system of claim 2 wherein the processor comprises a multiplier configured to multiply the magnetic field signal from each of the plurality of current sensors by the inverse coupling matrix.

4. The current sensor system of claim 1 wherein each of the plurality of conductors comprises a bus bar.

5. The current sensor system of claim 4 wherein each bus bar has a notch and the respective current sensor is positioned in the notch.

6. The current sensor system of claim 1 wherein the one or more magnetic field sensing elements comprises one or more of magnetoresistance elements or Hall effect elements.

7. The current sensor system of claim 6 wherein the one or more magnetic field sensing elements comprises one or more giant magnetoresistance elements.

8. A method for determining a current in one or more of a plurality of conductors, comprising:

providing a plurality of current sensors each having one or more magnetic field sensors, wherein the plurality of current sensors comprises a first number of current sensors;

providing a plurality of conductors, each configured to carry a current to be measured, wherein the plurality of conductors comprises a second number of conductors that is equal to the first number of current sensors, wherein the one or more magnetic field sensors of each current sensor are configured to generate a respective magnetic field signal indicative of a detected magnetic field;

positioning each of the plurality of current sensors in proximity to a respective one of the plurality of conductors and spaced from the other ones of the plurality of conductors;

for each current sensor, characterizing a magnetic coupling between the current sensor and each of the plurality of conductors by determining an intended coupling factor indicative of a magnetic coupling between the current sensor and the respective one of the plurality of conductors and determining one or more parasitic coupling factors indicative of a magnetic coupling between the respective one of the plurality of conductors and the other ones of the plurality of current sensors;

forming a coupling matrix containing the intended coupling factor and the one of more parasitic coupling factors; and using the coupling matrix to determine the current in one or more of the plurality of conductors.

9. The method of claim 8 further comprising generating an inverse coupling matrix corresponding to an inverse of the coupling matrix.

10. The method of claim 9 wherein using the magnetic coupling characterization to determine the current in one or more of the plurality of conductors comprises multiplying the magnetic field signals from each of the plurality of current sensors by the inverse matrix.

11. The method of claim 8 wherein determining the intended coupling factor indicative of the magnetic coupling between the current sensor and the respective one of the plurality of conductors comprises:

providing a reference current to the respective one of the plurality of conductors; and measuring the magnetic field signal from the current sensor.

12. The method of claim 8 wherein determining the one or more parasitic coupling factors indicative of the magnetic coupling between the respective one of the plurality of conductors and the other ones of the plurality of current sensors comprises:

providing a reference current to the respective one of the plurality of conductors; and measuring the magnetic field signal from the other ones of the plurality of current sensors.

13. A method for determining a current in one or more conductors of a current sensor system comprising a plurality of current sensors, each positioned proximate to a respective one of a plurality of conductors and spaced from one or more other ones of the plurality of conductors, wherein the plurality of current sensors comprises a first number of current sensors and the plurality of conductors comprises a second number of conductors equal to the first number of current sensors, the method comprising:

for each of the plurality of conductors, providing a reference current to the conductor and measuring an output signal of the respective current sensor and each of the other ones of the plurality of current sensors;

generating a coupling matrix comprising, for each of the plurality of current sensors, an intended coupling factor indicative of a magnetic coupling between the current sensor and the respective one of the plurality of conductors and one or more parasitic coupling factors indicative of a magnetic coupling between the respective one of the plurality of conductors and the other ones of the plurality of current sensors;

determining an inverse coupling matrix based on the coupling matrix; and using the inverse coupling matrix to determine a current in one or more of the plurality of conductors.

14. The method of claim 13 wherein providing the reference current to each of the plurality of conductors comprises providing the reference current to each of the plurality of conductors in a predetermined order.

15. The method of claim 13 wherein measuring the output signal of the respective current sensor and each of the other ones of the plurality of current sensors comprises measuring a magnetic field signal generated by the respective current sensor and each of the other ones of the plurality of current sensors in response to a detected magnetic field.

16. The method of claim 15 wherein using the inverse coupling matrix to determine the current in one or more of the plurality of conductors comprises multiplying the inverse coupling matrix by a magnetic field signal matrix comprising magnetic field signals generated by each of the plurality of current sensors.

17. The method of claim 15 wherein generating the coupling matrix comprises computing the intended coupling factor by dividing the output signal of the respective current sensor by the reference current.

18. The method of claim 15 wherein generating the coupling matrix further comprises computing the one or more parasitic coupling factors by dividing the output signal of each of the other ones of the plurality of current sensors by the reference current.

19. The method of claim 13 further comprising, for each of the plurality of conductors, providing multiple reference currents to the conductor and measuring an output signal of the respective current sensor and each of the other ones of the plurality of current sensors.

20. The method of claim 19, further comprising generating the coupling matrix comprising, for each of the plurality of current sensors, an average intended coupling factor indicative of a magnetic coupling between the current sensor and the respective one of the plurality of conductors and one or more average parasitic coupling factors indicative of a magnetic coupling between the respective one of the plurality of conductors and the other ones of the plurality of current sensors.

21. A current sensor system comprising:
a plurality of means for detecting a magnetic field signal, each positioned proximate to a respective one of a plurality of conductors configured to carry a current to be measured and spaced from one or more other ones of the plurality of conductors, wherein the plurality of means comprises a first number of means and wherein the plurality of conductors comprises a second number of conductors and wherein the first number and the second number are equal; and
means coupled to each of the plurality of magnetic field detecting means for determining a magnetic coupling between the magnetic field detecting means and each of the plurality of conductors, the magnetic coupling determining means configured to:
determine an intended coupling factor indicative of a magnetic coupling between the magnetic field detecting means and the respective conductor and one or more parasitic coupling factors indicative of a magnetic coupling between the magnetic field detecting means and the other ones of the plurality of conductors;
generate a coupling matrix comprising the intended coupling factor and the one or more parasitic coupling factors for each of the plurality of magnetic field detecting means, and an inverse coupling matrix corresponding to an inverse matrix of the coupling matrix; and
use the coupling matrix to determine the current in one or more of the plurality of conductors.

22. The current sensor system of claim 21 wherein the magnetic coupling determining means comprises a multiplier configured to multiply the magnetic field signal from each of the plurality of magnetic field detecting means by the inverse coupling matrix.

* * * * *

UNITED STATES PATENT AND TRADEMARK OFFICE
CERTIFICATE OF CORRECTION

PATENT NO. : 10,761,120 B2
APPLICATION NO. : 15/435725
DATED : September 1, 2020
INVENTOR(S) : Christian Feucht et al.

It is certified that error appears in the above-identified patent and that said Letters Patent is hereby corrected as shown below:

In the Specification

Column 3, Line 8 delete "of more" and replace with --or more--.

Column 6, Line 12 delete "plurality a" and replace with --plurality of--.

Column 6, Line 26 delete "only the" and replace with --only to the--.

Column 6, Line 51 delete "Conductors 106a-106" and replace with --Conductors 106a-106n--.

Column 6, Line 54 delete "conductors 106a-106" and replace with --conductors 106a-106n--.

Column 8, Line 8 delete "106a-016n," and replace with --106a-106n,--.

Column 10, Line 7 delete "as a one" and replace with --as one--.

Column 11, Line 6 delete "seventh amplifier," and replace with --seventh amplifier 336,--.

Column 12, Lines 48-49 delete "corresponding the" and replace with --corresponding to the--.

Column 12, Line 62 delete "and or" and replace with --and a--.

Column 12, Line 63 delete "paired the" and replace with --paired with the--.

Column 17, Line 52 delete "sensors a in" and replace with --sensors in--.

Column 17, Line 66 delete "current sensor (e.g." and replace with --current sensors (e.g.--.

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*